(12) United States Patent
Kuwajima et al.

(10) Patent No.: US 7,832,056 B2
(45) Date of Patent: Nov. 16, 2010

(54) OPENING-CLOSING DEVICE

(75) Inventors: Hideki Kuwajima, Osaka (JP); Yasuchika Kudo, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 11/937,189

(22) Filed: Nov. 8, 2007

(65) Prior Publication Data
US 2008/0109995 A1    May 15, 2008

(30) Foreign Application Priority Data
Nov. 13, 2006 (JP) ............................. 2006-306339
Jul. 11, 2007 (JP) ............................. 2007-181930

(51) Int. Cl.
*E05D 15/06* (2006.01)
(52) U.S. Cl. .............................. 16/354; 16/282; 16/287; 16/366; 16/368; 361/679.27; 361/679.3; 379/433.13
(58) Field of Classification Search .................. 16/282, 16/287, 288, 294, 302, 366–370, 330, 371, 16/374, 377, 354, 387; 361/679.06, 679.22, 361/679.27, 679.3, 683; 379/433.11, 433.13; 455/575.3
See application file for complete search history.

(56) References Cited
U.S. PATENT DOCUMENTS
4,765,027 A * 8/1988 Andric ........................ 16/354

2007/0054710 A1 * 3/2007 Pan ............................ 455/575.3
2007/0226955 A1 * 10/2007 Cho et al. ...................... 16/354
2009/0013500 A1 * 1/2009 Ueyama et al. ................ 16/354
2009/0070961 A1 * 3/2009 Chung et al. .................. 16/354

FOREIGN PATENT DOCUMENTS

| JP | 2002-171324 | | 6/2002 |
| JP | 2006-144892 | A | 6/2006 |
| JP | 2006-207351 | A | 8/2006 |
| WO | WO 2006080308 | A1 * | 8/2006 |

* cited by examiner

*Primary Examiner*—Victor Batson
*Assistant Examiner*—Emily M Morgan
(74) *Attorney, Agent, or Firm*—RatnerPrestia (57) ABSTRACT

An opening-closing device includes a fixed gear of a fixed body, a conversion gear engaged with the fixed gear, a movable gear of a movable body, and a relay gear engaged with the conversion gear and with the movable gear, all of which are attached to a locking plate. The movable body can be held at a predetermined angle with respect to the fixed body by making an engaging portion in the locking plate is contacted with a locking portion in the fixed body and by making the conversion gear move to another position when the movable body is opened at the predetermined angle with respect to the fixed body. Moving the conversion gear to another position makes it possible to perform opening and closing operations in a greater angle. Thus, the opening-closing device can have a simple structure and perform a variety of opening and closing operations.

11 Claims, 12 Drawing Sheets

OPENING-CLOSING DEVICE

BACKGROUND OF THE INVENTION

1. Field of the Invention

The present invention relates to opening-closing devices used in various electronic devices such as mobile phones and personal computers.

2. Background Art

In recent years, electronic devices such as mobile phones and personal computers are reducing in size and weight, so that more and more such devices are designed to be of the so-called folding type in which the movable housing is opened and closed with respect to the fixed housing. As a result, opening-closing devices used in such electronic devices are also expected to be easier to use and to have a wider variety of opening and closing operations.

An electronic device having a conventional opening-closing device is described as follows by taking a mobile phone shown in FIG. 12 as an example.

Figure 12:
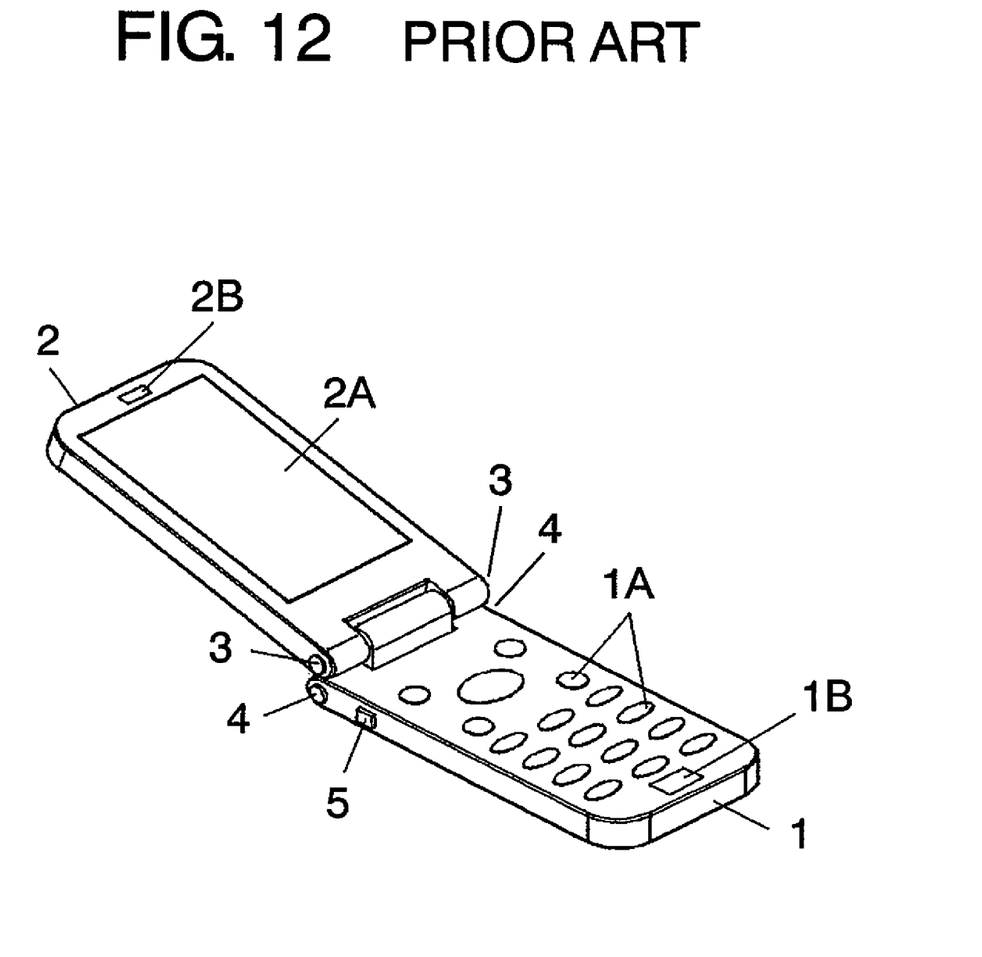
FIG. 12 is a perspective view of a conventional mobile phone.

FIG. 12 is a perspective view of the conventional mobile phone. The mobile phone includes fixed housing 1 and movable housing 2. Fixed housing 1 is provided on its top surface with operating part 1A having a plurality of arranged keys and with voice input portion 1B such as a microphone.

Movable housing 2 is provided on its surface with display portion 2 such as an LCD and voice output portion 2B such as a speaker. The lower end of movable housing 2 is openably and closably coupled to the upper end of fixed housing 1 via a pair of opening-closing devices 3 and 4.

The pair of opening-closing devices 3 and 4 are each formed of a plurality of cams and springs (unillustrated) and coupled to each other via a coupling member (unillustrated). The pair of opening-closing devices 3 and 4 are installed between fixed housing 1 and movable housing 2, thereby allowing movable housing 2 to be supported openably and closably with respect to fixed housing 1. Thus, fixed and movable housings 1, 2 and opening-closing devices 3, 4 form the electronic device.

When movable housing 2 is closed with respect to fixed housing 1, opening-closing device 3 applies a biasing force to movable housing 2 in the closing direction so as to keep movable housing 2 closed.

Then, when the user opens movable housing 2 with the hand, opening-closing device 3 applies a force to movable housing 2 in the opening direction. As a result, as shown in FIG. 12, movable housing 2 is opened with respect to fixed housing 1 at a predetermined angle of, for example, 160 degrees.

In this situation, if the user pushes switch push button 5 provided on a side surface of fixed housing 1, movable housing 2 is opened wider. This time, opening-closing device 4 applies a biasing force to movable housing 2 in the opening direction, bringing the rear surface of movable housing 2 into contact with the rear surface of fixed housing 1. In other words, movable housing 2 has rotated 360 degrees.

In this manner, the pair of opening-closing devices 3 and 4 are designed so that movable housing 2 is opened by opening-closing device 3 up to around 160 degrees which is suitable for the user to make a phone call and then opened by opening-closing device 4 up to 360 degrees at which operating part 1A and display portion 2A are exposed on the top and bottom, respectively. A conventional art relating to the present invention is shown in Japanese Patent Unexamined Publication No. 2002-171324.

In the aforementioned conventional example, movable housing 2 is opened to and closed from the predetermined angle using opening-closing device 3 and then opened to and closed from the 360 degree angle using opening-closing device 4 by pushing switch push button 5. As a result, the pair of opening-closing devices require a complicated structure due to a large number of components and the time to be installed in an electronic device and to perform the opening and closing operations.

SUMMARY OF THE INVENTION

An opening-closing device of the present invention includes a fixed body connected to a fixed holder and including a fixed gear; a movable body connected to a movable holder and including a movable gear; a conversion gear engaged with the fixed gear; a relay gear engaged with the conversion gear and the movable gear; and a locking plate having these gears attached thereto. An engaging portion provided at the locking plate, wherein the engaging portion is contacted with a locking portion formed at one of the fixed body and the fixed holder when the movable holder is opened at a predetermined angle with respect to the fixed holder, thereby allowing the conversion gear to move.

This structure allows the movable holder to be held at a predetermined angle with respect to the fixed holder by the locking portion and the engaging portion when the movable holder is opened at the predetermined angle with respect to the fixed holder. Then, the conversion gear can be moved to another position so as to perform opening and closing operations in a greater angle. Thus, the opening-closing device can have a simple structure and perform a variety of opening and closing operations.

The opening-closing device of the present invention may include a reinforcing locking plate, which is rotatably supported and attached to the substantially center of the locking plate; and an engaging portion provided at the reinforcing locking plate, wherein the engaging portion is contacted with a locking portion formed at one of the movable body and the movable holder when the movable holder is opened at the predetermined angle with respect to the fixed holder.

In this structure, the two engaging portions formed in the locking plate and the reinforcing locking plate, respectively, are contacted with the corresponding locking portions when the opening-closing device is opened at a predetermined angle, thereby allowing the movable holder to be held more securely with respect to the fixed holder.

DETAILED DESCRIPTION OF THE INVENTION

Embodiments of the present invention are described as follows with reference to drawings.

First Embodiment

Opening-closing device 40 according to a first embodiment of the present invention is described as follows with reference to FIGS. 1 to 7D.

Figure 1:
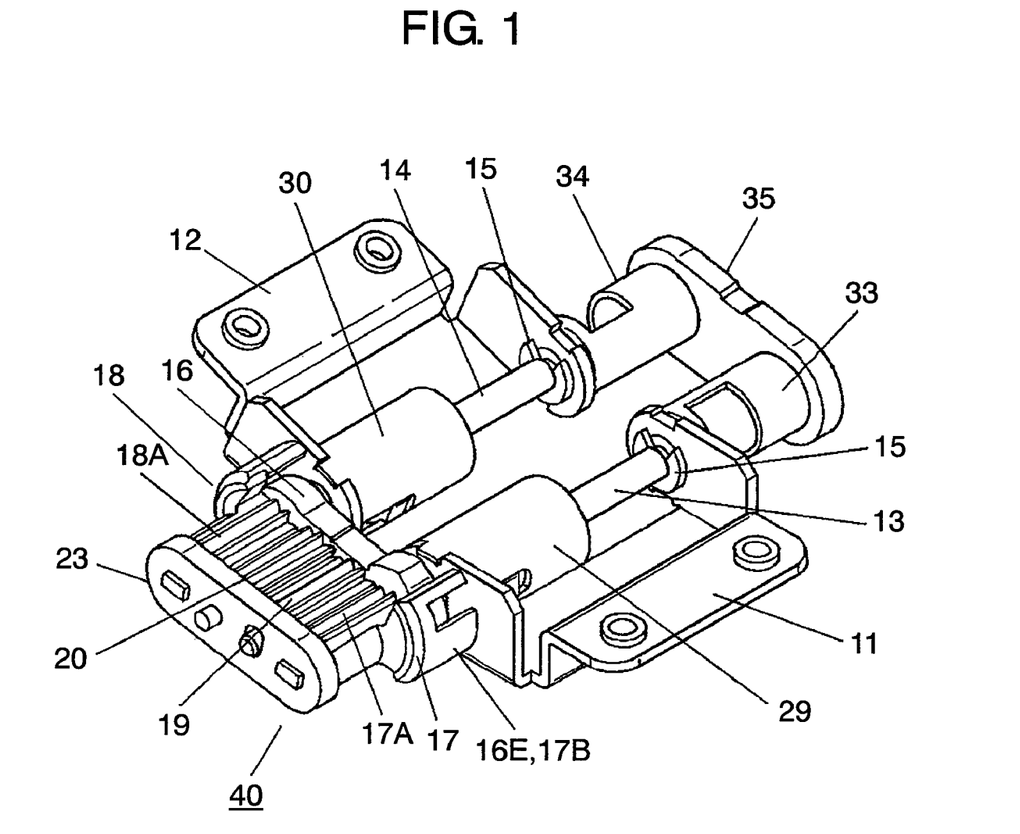
FIG. 1 is a perspective view of an opening-closing device according to a first embodiment of the present invention.
Figure 2:
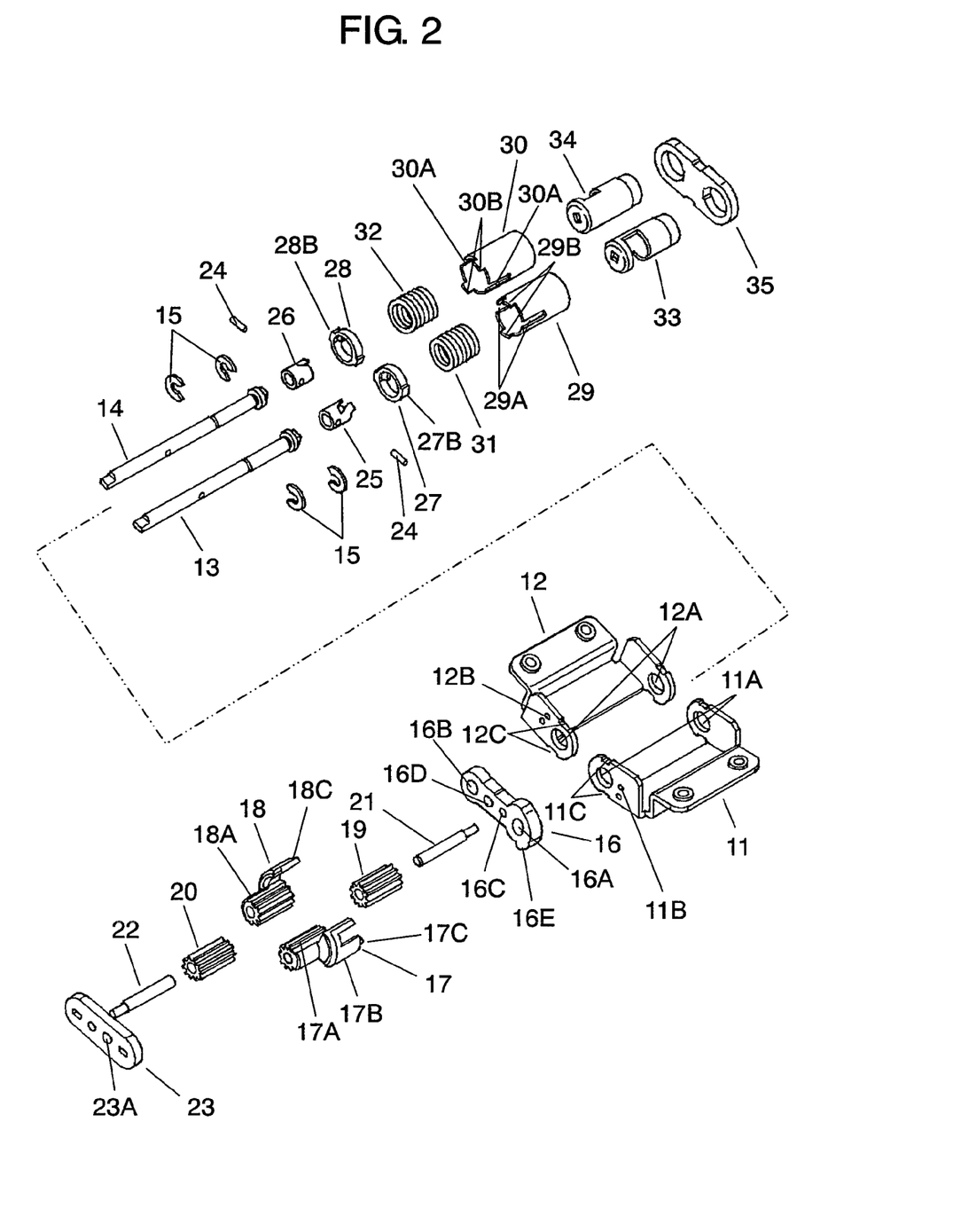
FIG. 2 is an exploded perspective view of the opening-closing device according to the first embodiment of the present invention.

FIG. 1 is a perspective view of opening-closing device 40 of the embodiment of the present invention, and FIG. 2 is an exploded perspective view of opening-closing device 40.

The following is a description of the structure of opening-closing device 40. As shown in FIGS. 1 and 2, opening-closing device 40 includes fixed holder 11 and movable holder 12 which are made of sheet steel or insulating resin. Fixed holder 11 is provided at both ends thereof with a pair of throughholes 11A into which substantially cylindrical fixed shaft 13 is rotatably inserted. In the same manner, movable holder 12 is provided at both ends thereof with a pair of throughholes 12A into which movable shaft 14 is rotatably inserted. Fixed shaft 13 is locked into fixed holder 11 with retaining rings 15. In the same manner, movable shaft 14 is locked into movable holder 12 with other retaining rings 15.

Opening-closing device 40 further includes locking plate 16 made of metal or insulating resin. Locking plate 16 has hole 16A at one end thereof and hole 16B at the other end thereof. Fixed shaft 13 projecting from the left end of fixed holder 11 is rotatably inserted into hole 16A. Movable shaft 14 projecting from the left end of movable holder 12 is rotatably inserted into hole 16B.

Opening-closing device 40 further includes fixed body 17 and movable body 18, which are substantially semi-cylindrical and made of steel, copper alloy, or insulating resin. Fixed body 17 and movable body 18 include fixed gear 17A and movable gear 18A, respectively. Fixed body 17 further includes locking portion 17B, which is a substantially arcuate wall portion formed by notching. Fixed body 17 is rotatably attached to the left end of fixed shaft 13, and movable body 18 is rotatably attached to the left end of movable shaft 14.

Fixed body 17 has projection 17C at its right end, and movable body 18 has projection 18C at its right end. Projection 17C is inserted into hole portion 11B formed at the left end of fixed holder 11, and projection 18C is inserted into hole portion 12B formed at the left end of movable holder 12. Consequently, fixed body 17 and movable body 18 are fixedly connected to fixed holder 11 and to movable holder 12, respectively.

Opening-closing device 40 further includes conversion gear 19 and relay gear 20, which are substantially cylindrical and made of metal or insulating resin. Conversion gear 19 is provided at its center with a hollow cylindrical portion into which substantially cylindrical conversion shaft 21 is inserted. Relay gear 20 is provided at its center with a hollow cylindrical portion into which relay shaft 22 is inserted. The right end of conversion shaft 21 is fixed to hole 16C formed at the center of locking plate 16, and the right end of relay shaft 22 is inserted into hole 16D of locking plate 16.

Locking plate 16 is provided at the right lower end with engaging portion 16E projecting outward. As shown in the partial side view of FIG. 3A, hole 16B of locking plate 16 is a circle having a slightly larger diameter than movable shaft 14 inserted therein. Hole 16A is an oval having a slightly larger diameter than fixed shaft 13 inserted therein. Hole 16D is an oval having a slightly larger diameter than relay shaft 22 inserted therein.

Conversion gear 19 is engaged with fixed gear 17A. Relay gear 20 is engaged with conversion gear 19 and with movable gear 18A. The left end of each of relay shaft 22, fixed shaft 13, and movable shaft 14 is fixed to connector plate 23. The left end of conversion shaft 21 is movably inserted into oval hole 23A of connector plate 23.

Opening-closing device 40 further includes fixed cams 25 and 26, which are substantially cylindrical and made of metal such as steel, copper alloy, or sintered alloy. Fixed cams 25 and 26 each include a jagged cam portion 25A, 26A around the outer periphery of the right end, respectively. Fixed cam 25 is fixed to the longitudinal center of fixed shaft 13 with pin 24. Fixed cam 26 is fixed to the longitudinal center of movable shaft 14 with another pin 24.

Opening-closing device 40 further includes movable cams 27 and 28, which are substantially annular and made of metal such as steel, copper alloy, or sintered alloy. Movable cam 27 is disposed so as to be rotatable around fixed cam 25 in the opening and closing direction of movable body 18 and to be movable in the axial direction. Movable cam 28 is disposed so as to be rotatable around fixed cam 26 in the opening and closing direction of movable body 18 and to be movable in the axial direction. Movable cams 27 and 28 are each provided at an inner periphery thereof with a pair of cam portions 27A and a pair of cam portions 28A, respectively, which are pin-shaped and project to each other.

Opening-closing device 40 further includes cases 29 and 30 and springs 31 and 32. Cases 29 and 30 are substantially cylindrical and made of metal. Springs 31 and 32 are coil-shaped and made of steel wire. Case 29 accommodates fixed cam 25 and movable cam 27, and case 30 accommodates fixed cam 26 and movable cam 28. Spring 31 is disposed in a slightly bent state between the right side surface of movable cam 27 and the inner surface of case 29. Spring 32 is disposed in a slightly bent state between the right side surface of movable cam 28 and the inner surface of case 30.

Figure 5A:
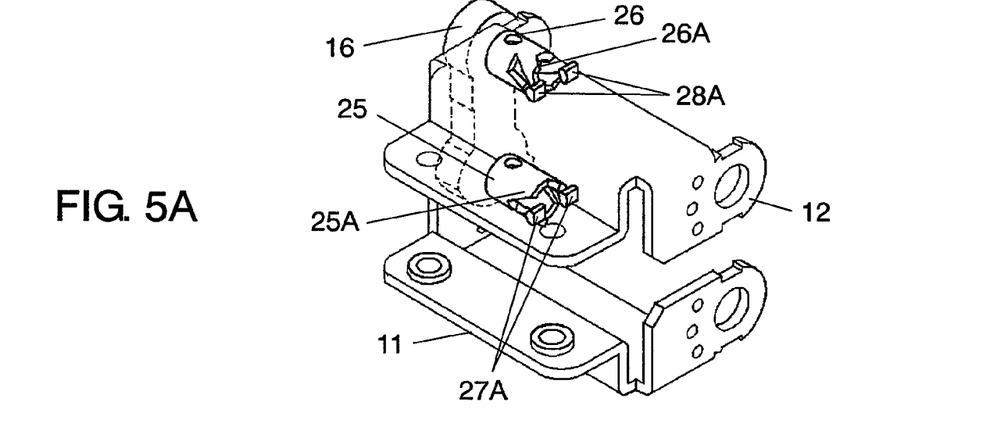
FIG. 5A is a partial perspective view of the opening-closing device according to the first embodiment of the present invention.
Figure 6A:
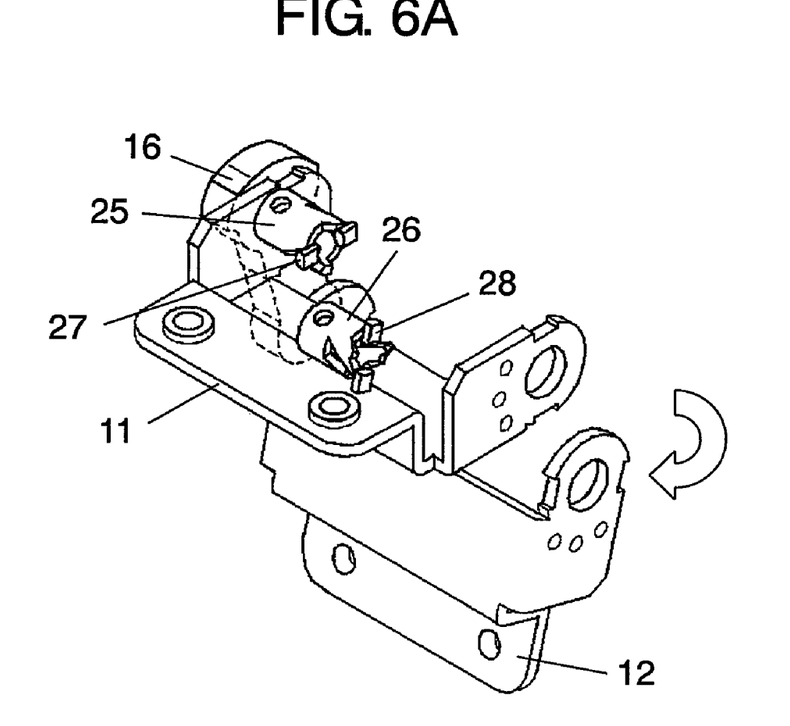
FIG. 6A is a partial perspective view of the opening-closing device according to the first embodiment of the present invention.

As shown in the partial perspective views of FIGS. 5A and 6A, spring 31 biases movable cam 27 toward fixed cam 25. Pin-shaped cam portions 27A are in resilient contact with predetermined positions of jagged cam portion 25A of fixed cam 25. In the same manner, spring 32 biases movable cam 28 toward fixed cam 26. Pin-shaped cam portions 28A are in resilient contact with predetermined positions of jagged cam portion 26A of fixed cam 26.

Case 29 has a pair of grooves 29A, and case 30 has a pair of grooves 30A. Movable cam 27 is provided at the outer periphery thereof with a pair of projections 27B projecting outward. Movable cam 28 is provided at the outer periphery thereof with a pair of projections 28B projecting outward. Projections 27B are inserted into grooves 29A, and projections 28B are inserted into grooves 30A. As a result, movable cam 27 can move with respect to case 29 in the axial direction and rotate together with case 29 in the rotational direction. Similarly, movable cam 28 can move with respect to case 30 in the axial direction and rotate together with case 30 in the rotational direction.

Case 29 is positioned to fixed shaft 13 with retaining rings 15. Case 30 is positioned to movable shaft 14 with other retaining rings 15. Case 29 is provided at the left end thereof with a pair of tongue portions 29B, which are locked into a pair of notches 11C of fixed holder 11, thereby being fixed to fixed holder 11. Case 30 is provided at the left end thereof with a pair of tongue portions 30B, which are locked into a pair of notches 12C of movable holder 12, thereby being fixed to movable holder 12.

Opening-closing device 40 further includes substantially cylindrical guide cylinders 33 and 34. Guide cylinder 33 is attached to the right end side of fixed holder 11 and fixed to the right end of fixed shaft 13. Guide cylinder 34 is attached to the right end side of movable holder 12 and fixed to the right end of movable shaft 14. Opening-closing device 40 further includes retainer plate 35 attached to the right end of guide cylinders 33 and 34.

Figure 7A:
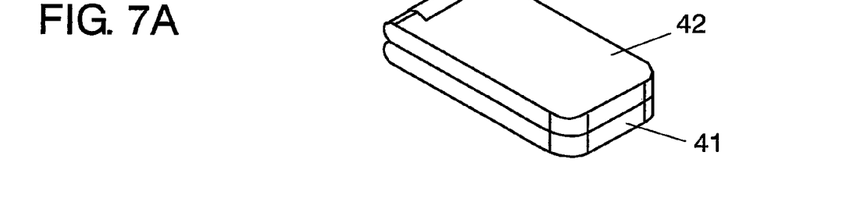
FIG. 7A is a perspective view of a mobile phone according to the first embodiment of the present invention.
Figure 7B:
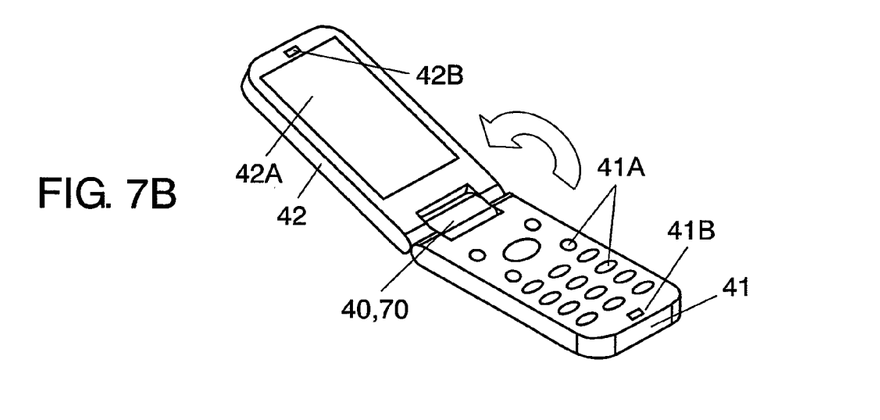
FIG. 7B is a perspective view of the mobile phone according to the first embodiment of the present invention.

In opening-closing device 40 thus structured, fixed holder 11 is attached to fixed housing 41, which is provided on its top surface with operating part 41A having a plurality of arranged keys and with voice input portion 41B such as a microphone as shown in the perspective view of the mobile phone of FIG. 7B. Movable holder 12 is attached to movable housing 42, which is provided on its surface with display portion 42A such as an LCD and voice output portion 42B such as a speaker. As a result, opening-closing device 40 allows movable housing 42 to be supported openably and closably with respect to fixed housing 41, thereby forming the electronic device.

Figure 3A:
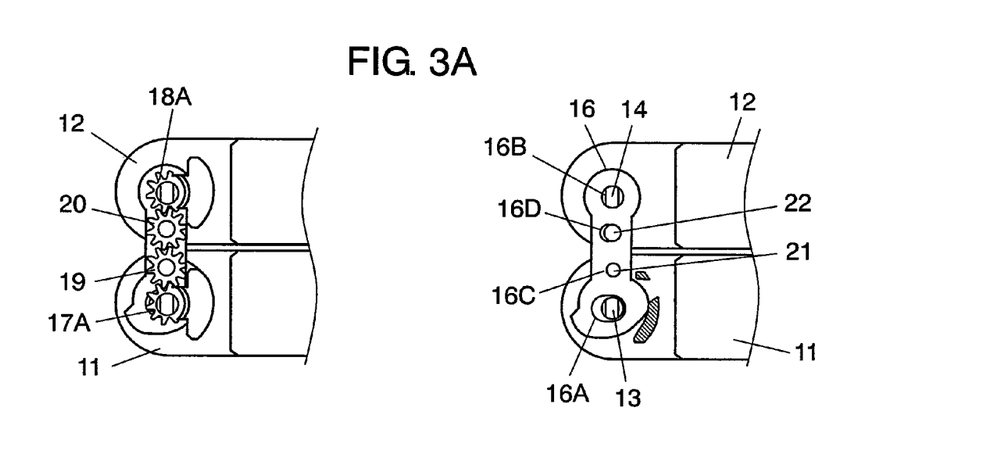
FIG. 3A is a partial side view of the opening-closing device according to the first embodiment of the present invention.

The following is a description of the operation of opening-closing device 40 thus structured. When movable housing 42 is closed with respect to fixed housing 41 as shown in FIG. 7A, movable holder 12 is in the closed state by being laid on the top surface of fixed holder 11 in opening-closing device 40 as shown in FIG. 3A.

In the closed state like this, as shown in FIG. 5A, fixed holder 11 is applied with a force in the closing direction by cam portions 27A in resilient contact with predetermined positions of movable cam 27 and cam portion 25A in resilient contact with predetermined positions of fixed cam 25. Movable holder 12 is applied with a force in the closing direction by cam portions 28A of movable cam 28 and cam portion 26A of fixed cam 26. As a result, the closed state is maintained.

Figure 3B:
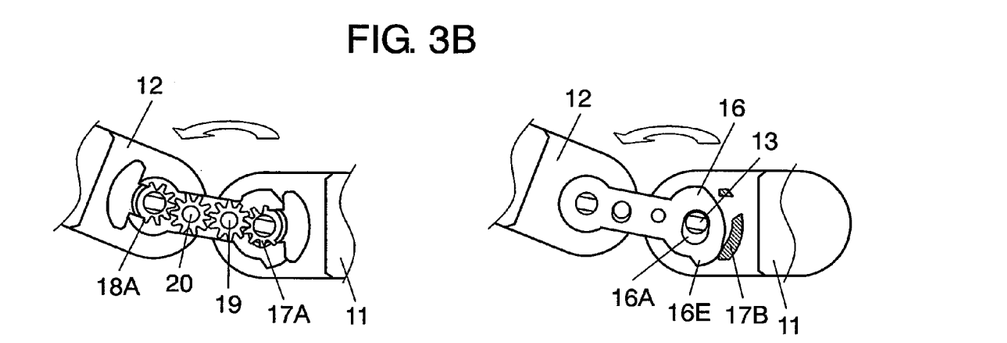
FIG. 3B is a partial side view of the opening-closing device according to the first embodiment of the present invention.

When the user opens movable housing 42 with the hand, as shown in FIG. 3B, movable holder 12, which is fixedly attached to movable housing 42 rotates around hole 16A of locking plate 16 into which fixed shaft 13 has been inserted. Then, conversion gear 19 engaged with fixed gear 17A rotates counterclockwise. Relay gear 20 engaged with conversion gear 19 and with movable gear 18A rotates clockwise. When movable housing 42 is opened to a predetermined angle, for example, around 160 degrees, engaging portion 16E at the right lower end of locking plate 16 is contacted with the inner periphery of locking portion 17B of fixed body 17.

Figure 5B:
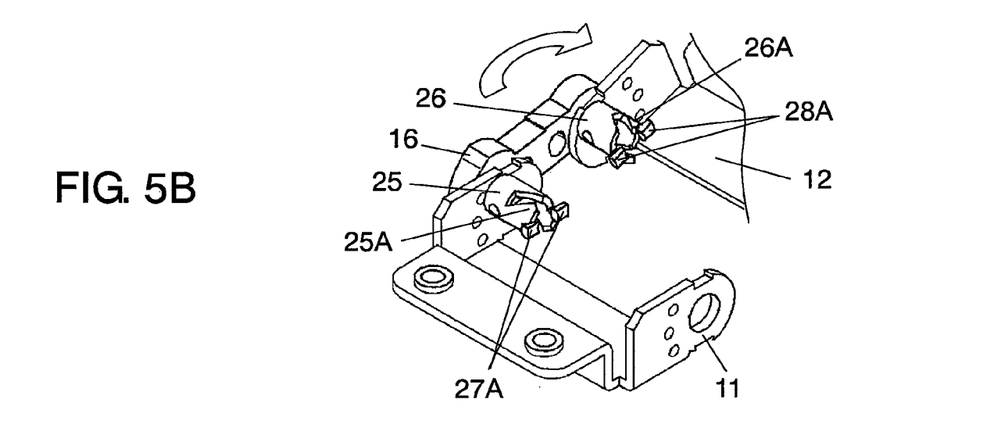
FIG. 5B is a partial perspective view of the opening-closing device according to the first embodiment of the present invention.

At the same time, as shown in FIG. 5B, case 30 rotates with the rotation of movable holder 12, so that movable cam 28 rotates while moving in the axial direction. In addition, fixed cam 25, which is fixed to fixed shaft 13, also rotates. These rotations cause cam portions 27A to slide in resilient contact with cam portion 25A, and cam portions 28A to slide in resilient contact with cam portion 26A. This changes the positions of cam portion 25A that are in resilient contact with cam portions 27A and the positions of cam portion 26A that are in resilient contact with cam portions 28A, thereby biasing movable holder 12 in the opening direction.

In this manner, movable holder 12 is biased in the opening direction, but locked so as not to open any further by engaging portion 16E and locking portion 17B. Consequently, as shown in FIG. 7B, movable housing 42 having movable holder 12 attached thereto is opened and kept at around 160 degrees which is suitable for the user to make a phone call.

Figure 3C:
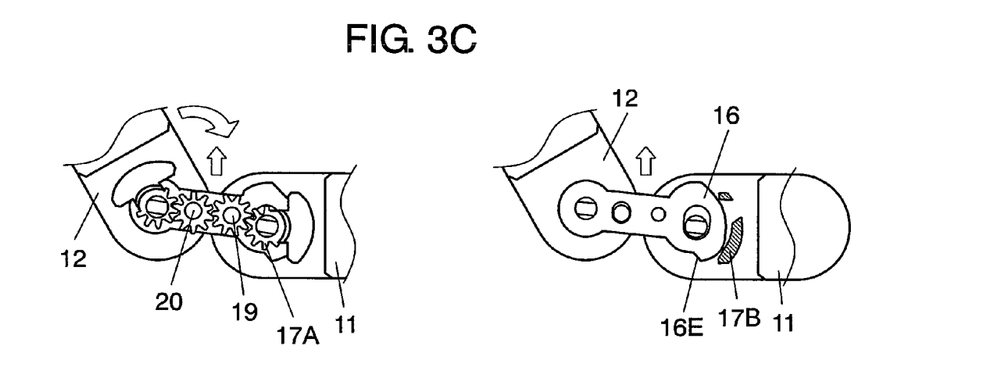
FIG. 3C is a partial side view of the opening-closing device according to the first embodiment of the present invention.
Figure 5C:
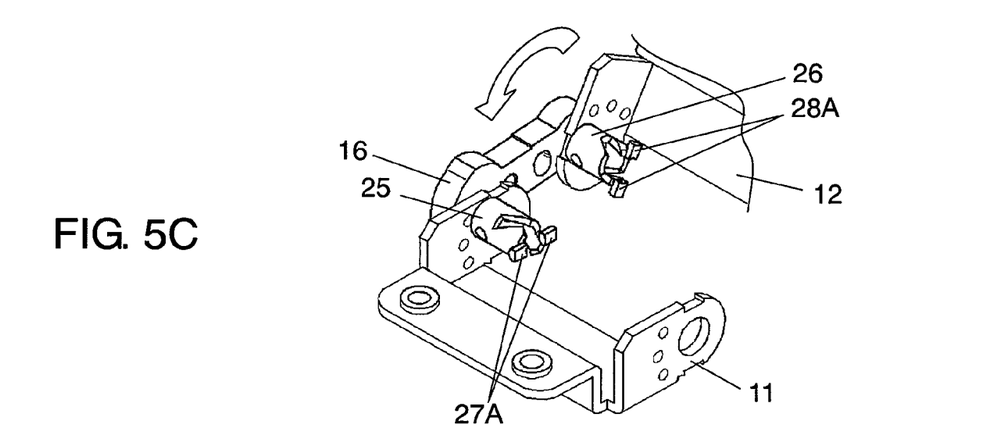
FIG. 5C is a partial perspective view of the opening-closing device according to the first embodiment of the present invention.

Next, as shown in FIGS. 3C and 5C, when the user slightly returns movable holder 12 in the closing direction from this state, conversion gear 19 rotates clockwise and moves above fixed gear 17A and relay gear 20. This causes locking plate 16 to move upward, thereby releasing engaging portion 16E from locking portion 17B.

Figure 4A:
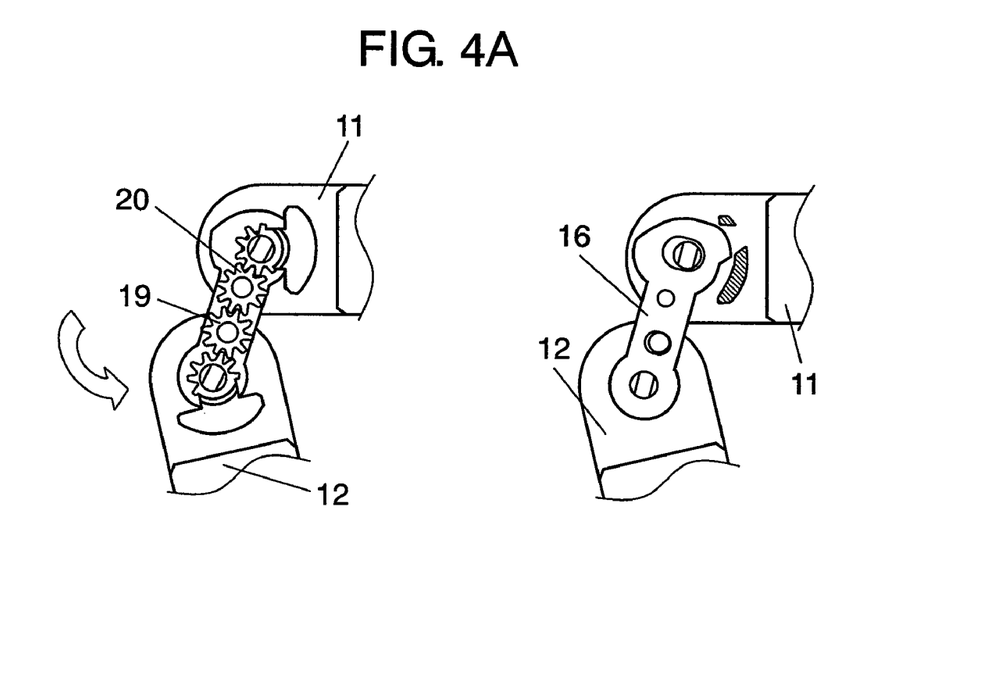
FIG. 4A is a partial side view of the opening-closing device according to the first embodiment of the present invention.
Figure 7C:
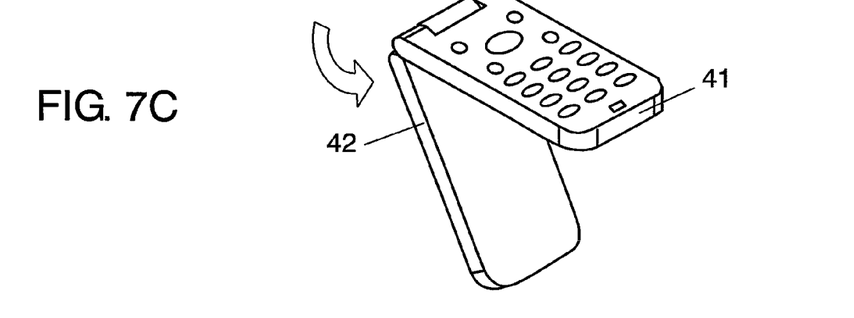
FIG. 7C is a perspective view of the mobile phone according to the first embodiment of the present invention.

Then, when the user further opens movable housing 42 in the opening direction as shown in FIG. 4A, conversion gear 19 rotates counterclockwise so as to rotate relay gear 20 clockwise, thereby rotating movable holder 12 in the opening direction as shown in FIG. 7C. Consequently, as shown in FIG. 6A, movable holder 12 is biased in the opening direction by movable cams 27, 28 and fixed cams 25, 26.

Figure 4B:
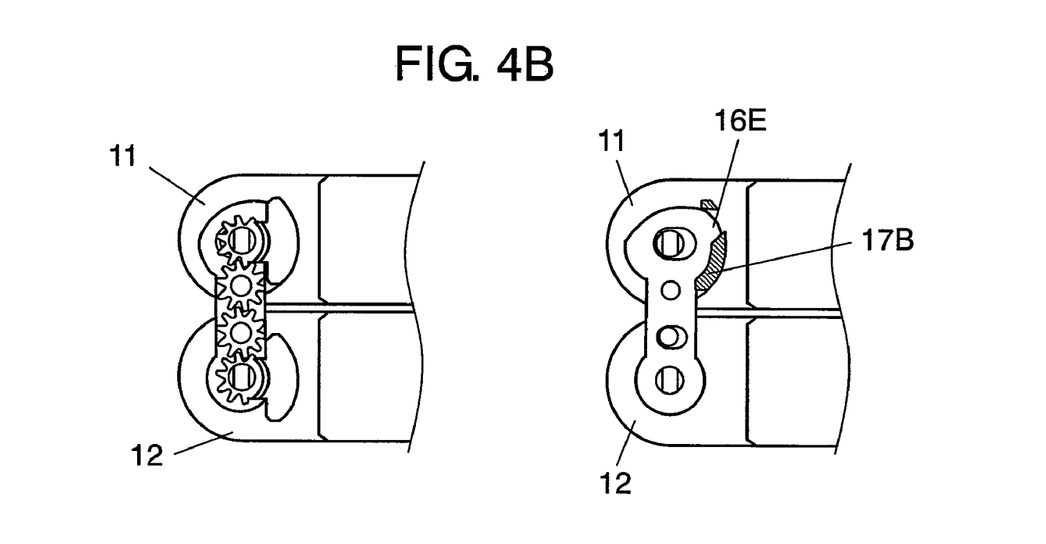
FIG. 4B is a partial side view of the opening-closing device according to the first embodiment of the present invention.
Figure 6B:
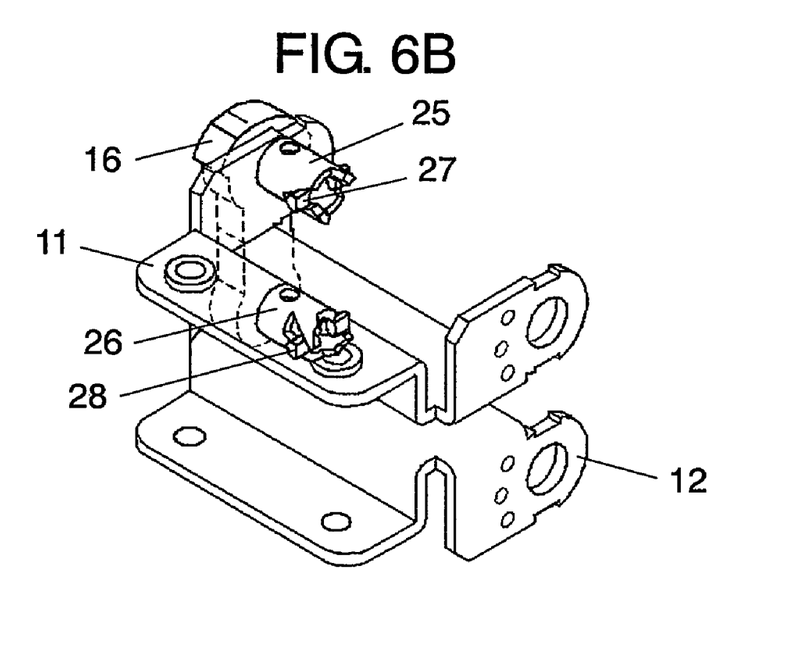
FIG. 6B is a partial perspective view of the opening-closing device according to the first embodiment of the present invention.
Figure 7D:
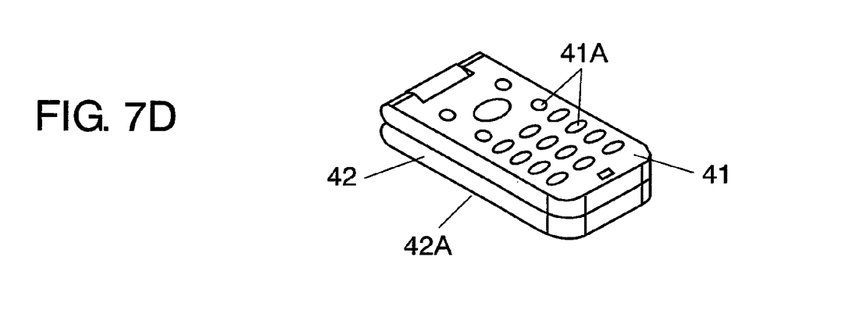
FIG. 7D is a perspective view of the mobile phone according to the first embodiment of the present invention.

When movable housing 42 is laid on the bottom surface of fixed housing 41 as shown in FIG. 7D, movable holder 12 is biased in the bottom surface direction of fixed holder 11 by movable cams 27, 28 and fixed cams 25, 26 as shown in FIG. 6B. As a result, as shown in FIG. 4B, movable holder 12 rotates 360 degrees with respect to fixed holder 11 and is laid on the bottom surface of fixed holder 11. At the same time, engaging portion 16E of locking plate 16 is contacted with the upper end of locking portion 17B of fixed body 17.

Thus, when movable holder 12 rotates 360 degrees with respect to fixed holder 11, movable holder 12 is biased in the bottom surface direction of fixed holder 11. As a result, movable housing 42 is laid and held on the bottom surface of fixed housing 41 by engaging portion 16E and locking portion 17B. This allows opening-closing device 40 to be held in a state shown in FIG. 7D where operating part 41A is exposed on the top surface and display portion 42A is exposed on the bottom surface. This makes it easy for the user to operate display portion 42A or to see the LCD.

As described above, opening-closing device 40 of the present embodiment includes fixed gear 17A of fixed body 17; conversion gear 19 engaged with fixed gear 17A; movable gear 18A of movable body 18; relay gear 20 engaged with conversion gear 19 and with movable gear 18A; and locking plate 16 having these gears attached thereto. Opening-closing device 40 further includes engaging portion 16E formed at the right lower end of locking plate 16, which allows conversion gear 19 to move to another position. Engaging portion 16E is contacted with the inner periphery of locking portion 17B of fixed body 17 when movable holder 12 to which movable body 18 has been fixed is opened at the predetermined angle with respect to fixed holder 11 to which fixed body 17 has been fixed.

When movable holder 12 is opened at a predetermined angle, for example, around 160 degrees with respect to fixed holder 11, movable holder 12 is locked by engaging portion 16E and locking portion 17B. This can keep movable housing 42 in a state which is suitable for the user to make a phone call.

When the user slightly returns movable holder 12 in the closing direction from this state, conversion gear 19 moves upward, thereby releasing the locked state. Since movable holder 12 can be rotated up to 360 degrees with respect to fixed holder 11, movable housing 42 is laid on the bottom surface of fixed housing 41. This allows opening-closing device 40 to be held in a state where operating part 41A is exposed on the top surface and display portion 42A is exposed on the bottom surface. This makes it easy for the user to operate display portion 42A or to see the LCD.

Fixed cams 25, 26 and movable cams 27, 28, which interlock with each other during the opening and closing operations, bias movable holder 12 in the closing direction when it is closed, and in the opening direction when it is opened or has rotated 360 degrees with respect to fixed holder 11. This enables movable housing 42 to be quickly opened and closed or to be securely held with respect to fixed housing 41.

As described hereinbefore, according to the present embodiment, opening-closing device 40 includes fixed gear 17A of fixed body 17; conversion gear 19 engaged with fixed gear 17A; movable gear 18A of movable body 18; relay gear 20 engaged with conversion gear 19 and with movable gear 18A; and locking plate 16 having these gears attached thereto. Movable housing 42 can be held at a predetermined angle with respect to fixed body 17 by making engaging portion 16E of locking plate 16 is contacted with locking portion 17B of fixed body 17 and by making conversion gear 19 move to another position when movable body 18 is opened at the predetermined angle with respect to fixed body 17. Moving conversion gear 19 to another position makes it possible to perform opening and closing operations in a greater angle, thereby achieving an opening-closing device that has a simple structure and performs a variety of opening and closing operations.

In the aforementioned description, locking portion 17B is contacting with engaging portion 16E of locking plate 16 is formed in fixed body 17, but alternatively can be formed on the left end of fixed holder 11.

In the aforementioned description, movable housing 42 is opened and closed by the user with the hand so as to rotate movable holder 12. The present invention, however, can be applied to an opening-closing device having a so-called one-push open structure including components such as a push button and reverse cams. The opening-closing device having the one-push open structure allows movable holder 12 to open automatically, for example, to 160 degrees with respect to fixed holder 11 by pushing the push button. Then, the user can slightly return movable holder 12 with the hand in the closing direction to open movable holder 12 up to 360 degrees with respect to fixed holder 11.

Second Embodiment

Opening-closing device 70 of a second embodiment of the present invention is described with reference to FIG. 8 to FIG. 11B. Hereinafter, like components are labeled with like reference numerals with respect to the first embodiment, and the description of these components is not repeated.

Figure 8:
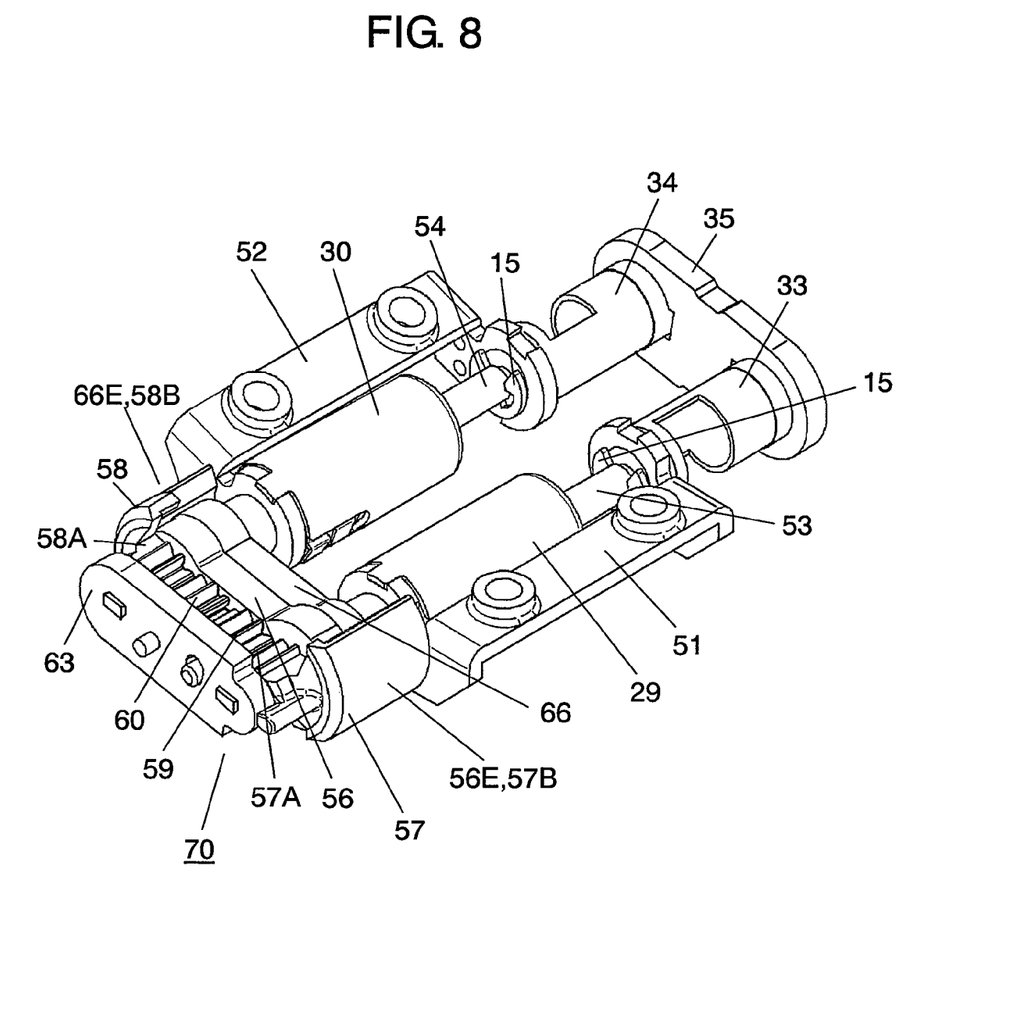
FIG. 8 is a perspective view of an opening-closing device according to a second embodiment of the present invention.
Figure 9:
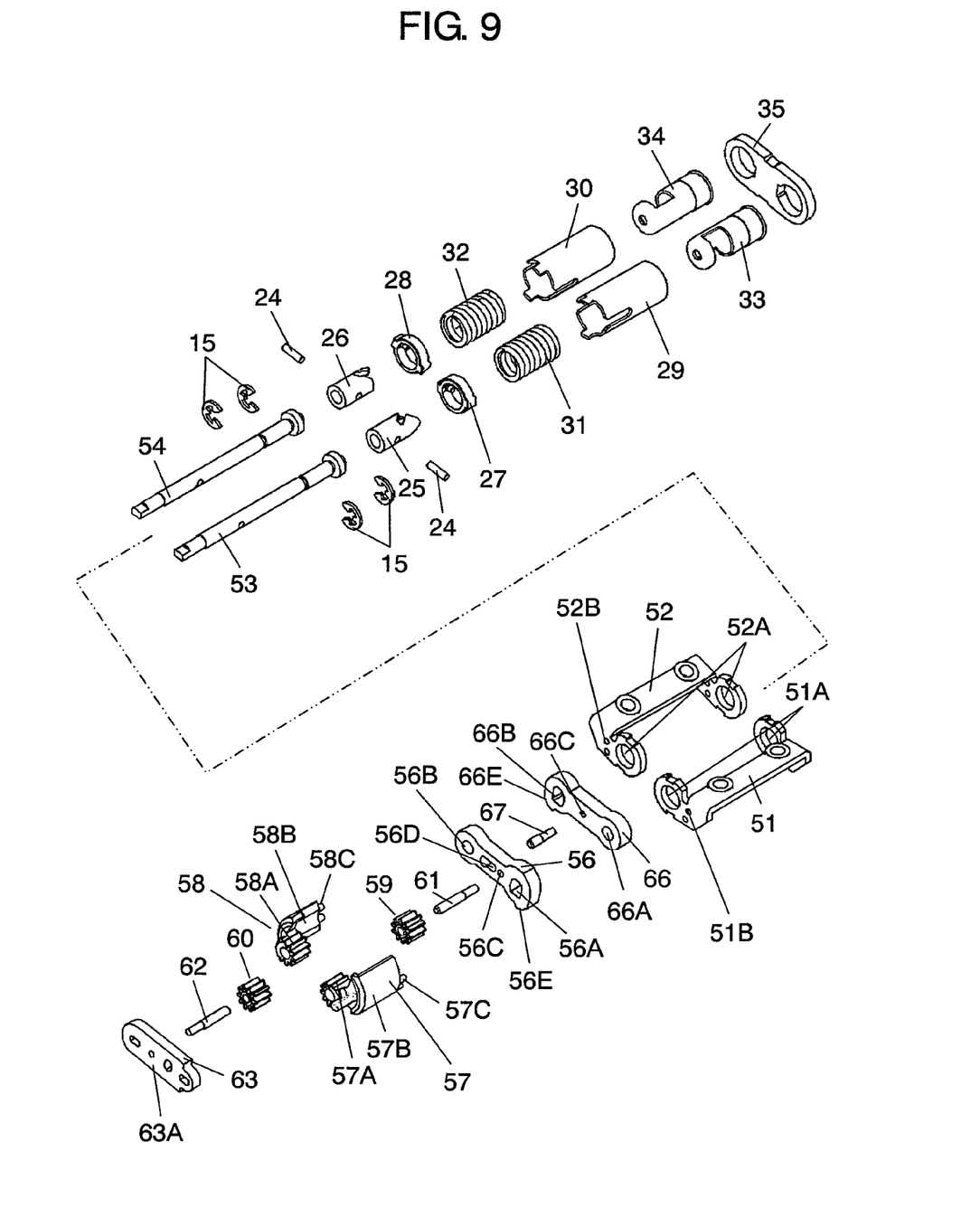
FIG. 9 is an exploded perspective view of the opening-closing device according to the second embodiment of the present invention.

FIG. 8 is a perspective view of opening-closing device 70 according to the second embodiment of the present invention, and FIG. 9 is an exploded perspective view of opening-closing device 70. Similar to the first embodiment, opening-closing device 70 includes fixed shaft 53 and movable shaft 54. Fixed holder 51 is provided at both ends thereof with a pair of throughholes 51A into which fixed shaft 53 is rotatably inserted. Fixed shaft 53 is locked into fixed holder 51 with retaining rings 15. Movable holder 52 is provided at both ends thereof with a pair of throughholes 52A into which movable shaft 54 is rotatably inserted. Movable shaft 54 is locked into movable holder 52 with retaining rings 15.

Locking plate 56, which is made of metal or insulating resin, has hole 56A at one end thereof and hole 56B at the other end thereof. Fixed shaft 53 projecting from the left end of fixed holder 51 is inserted into hole 56A, and movable shaft 54 projecting from the left end of movable holder 52 is inserted into hole 56B in the same manner as in the first embodiment.

Opening-closing device 70 is further provided with reinforcing locking plate 66, which is made of metal or insulating resin and laid between locking plate 56 and fixed and movable holders 51, 52. Reinforcing locking plate 66 has hole 66A and hole 66B at both ends thereof and hole 66C at the substantial center thereof. Fixed shaft 53 is inserted into hole 66A, and movable shaft 54 is inserted into hole 66B. Hole 66C is fixed to the right end of support shaft 67 whose left end is inserted into hole 56D formed at the substantial center of locking plate 56. Reinforcing locking plate 66 is rotatably supported and attached to locking plate 56.

Opening-closing device 70 further includes fixed body 57 and movable body 58, which are substantially semi-cylindrical. Opening-closing device 70 further includes fixed gear 57A of fixed body 57, conversion gear 59 engaged with fixed gear 57A, movable gear 58A of movable body 58, and relay gear 60 engaged with conversion gear 59 and with movable gear 58A. Conversion gear 59 has conversion shaft 61 inserted therein, and the right end of conversion shaft 61 is fixed to hole 56C of locking plate 56. Relay gear 60 has relay shaft 62 inserted therein, and the right end of relay shaft 62 is inserted into hole 56D. The left end of each of relay shaft 62, fixed shaft 53, and movable shaft 54 is fixed to connector plate 63. The left end of conversion shaft 61 is movably inserted into oval hole 63A of connector plate 63 in the same manner as in the first embodiment.

Locking plate 56 has engaging portion 56E at the right lower end thereof. Fixed body 57 has locking portion 57B, which is a substantially cylindrical wall portion corresponding to engaging portion 56E. Fixed body 57 is rotatably attached to the left end of fixed shaft 53 and movable body 58 is rotatably attached to the left end of movable shaft 54 in the same manner as in the first embodiment.

Reinforcing locking plate 66 is provided at the left lower end thereof with engaging portion 66E projecting outward. Movable body 58 is provided at the left outside with locking portion 58B, which is a substantially arcuate wall portion corresponding to engaging portion 66E.

Fixed body 57 is provided at the right end thereof with projection 57C which is inserted into hole portion 51B formed at the left end of fixed holder 51. Movable body 58 is provided at the right end thereof with projection 58C which is inserted into hole portion 52B formed at the left end of movable holder 52. Fixed body 57 and fixed holder 51 are fixedly connected to each other, and movable body 58 and movable holder 52 are fixedly connected to each other in the same manner as in the first embodiment.

Hole 56A of locking plate 56 is an oval having a larger diameter than fixed shaft 53 inserted therein. Hole 56B of locking plate 56 is a circle having a slightly larger diameter than movable shaft 54 inserted therein. Hole 56D consists of left and right portions joined together so as to be shaped like the letter L. The left portion is an oval slightly larger than relay shaft 62 inserted thereinto. The right portion is a long hole into which the left end of support shaft 67 is movably inserted.

Fixed shaft 53 has fixed cam 25 attached to the right side thereof, and movable shaft 54 has fixed cam 26 attached to the right side thereof. Fixed cam 25 is disposed opposite to movable cam 27, which is biased by spring 31. Fixed cam 26 is disposed opposite to movable cam 28, which is biased by spring 32. Spring 31 is housed in case 29, and spring 32 is housed in case 30. Fixed cam 25, fixed cam 26, movable cam 27, and movable cam 28 bias movable holder 52 in the closing direction when movable holder 52 is closed with respect to fixed holder 51. When opened or rotated 360 degrees, movable holder 52 is biased in the opening direction with respect to fixed holder 51 in the same manner as in the first embodiment.

Fixed holder 51 has guide cylinder 33 on the right side thereof, and movable holder 52 has guide cylinder 34 on the right side thereof. Guide cylinder 33 is fixed to the right end of fixed shaft 53, and guide cylinder 34 is fixed to the right end of movable shaft 54. Opening-closing device 70 further includes retainer plate 35 attached to the right end of guide cylinders 33 and 34. As shown in FIG. 7B, opening-closing device 70 thus structured allows fixed holder 51 and movable holder 52 to be supported openably and closably with respect to fixed housing 41 and movable housing 42, respectively, thereby forming the electronic device in the same manner as in the first embodiment.

In the electronic device having opening-closing device 70 structured as described above, movable housing 42 is opened and closed with respect to fixed housing 41 in the same manner as in the first embodiment. Primary operational differences between opening-closing device 70 of the present embodiment and opening-closing device 40 of the first embodiment are described as follows with reference to FIGS. 7A to 7D, 10A to 10C, and 11A and 11B.

Figure 10A:
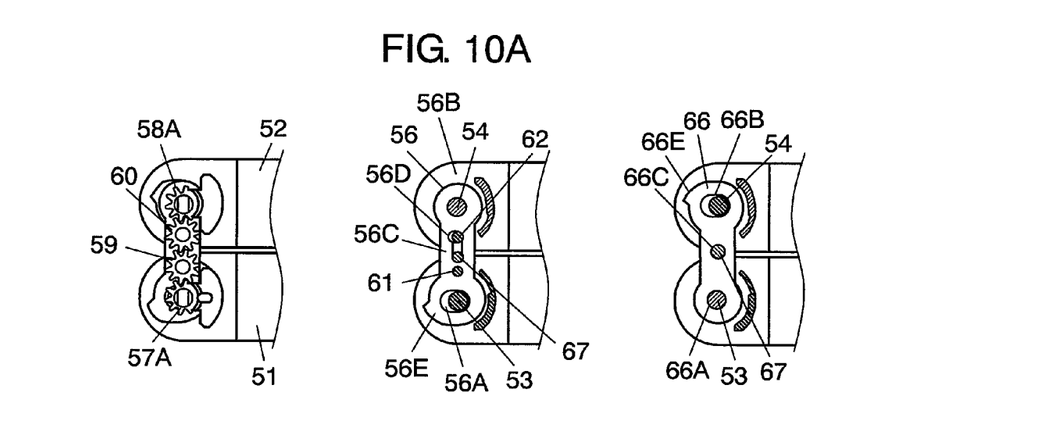
FIG. 10A is a partial side view of the opening-closing device according to the second embodiment of the present invention.
Figure 10B:
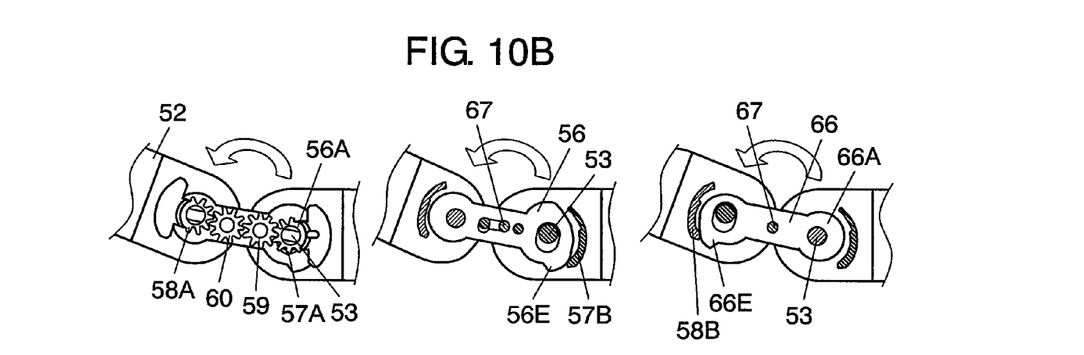
FIG. 10B is a partial side view of the opening-closing device according to the second embodiment of the present invention.
Figure 10C:
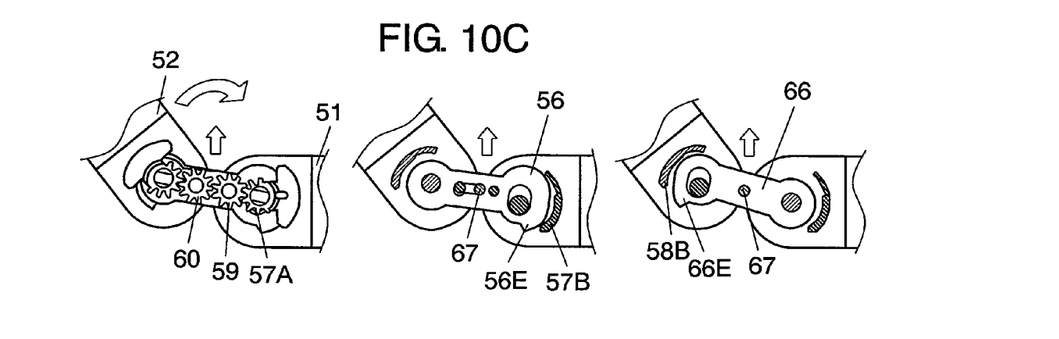
FIG. 10C is a partial side view of the opening-closing device according to the second embodiment of the present invention.

FIGS. 10A to 10C are side views of an essential part of opening-closing device 70 of the present embodiment. In these drawings, the left side views mainly show fixed gear 57A of fixed body 57, conversion gear 59, relay gear 60, and movable gear 58A of movable body 58. The center views mainly show locking plate 56. The right side views mainly show reinforcing locking plate 66.

The following is a description of operations that are performed when the user opens movable housing 42 with the hand as shown in FIG. 7B from the closed state where movable holder 52 is laid on fixed holder 51 of opening-closing device 70 and biased in the closing direction as shown in FIG. 7A or 10A. As shown in FIG. 10B, movable holder 52 rotates around hole 56A of locking plate 56 having fixed shaft 53 inserted therein and also around hole 66A of reinforcing locking plate 66. This allows conversion gear 59 engaged with fixed gear 57A to rotate counterclockwise, and relay gear 60 engaged with conversion gear 59 and with movable gear 58A to rotate clockwise. As a result, movable holder 52 is opened at a predetermined angle, for example, around 160 degrees with respect to fixed holder 51.

At the same time, engaging portion 56E at the right lower end of locking plate 56 is contacted with the inner periphery of locking portion 57B of fixed body 57. Engaging portion 66E at the left lower end of reinforcing locking plate 66 laid on the right side surface of locking plate 56 also is contacted with the inner periphery of locking portion 58B of movable body 58. Thus, movable holder 52 is held at a predetermined angle with respect to fixed holder 51.

Not only that engaging portion 56E of locking plate 56 is contacted with locking portion 57B of fixed body 57, but also engaging portion 66E of reinforcing locking plate 66 is contacted with and held by locking portion 58B of movable body 58. This structure allows movable holder 52 to be held at a predetermined angle more securely with respect to fixed holder 51. As a result, movable housing 42 can be held at a predetermined angle more securely with respect to fixed housing 41 even when movable housing 42 is strongly biased or pushed at a predetermined angle in the opening direction.

The following is a description of operations that are performed when the user slightly returns movable holder 52 in the closing direction as shown in FIG. 10C. First, conversion gear 59 rotates clockwise and moves above fixed gear 57A and relay gear 60. This also makes locking plate 56 and reinforcing locking plate 66 connected to each other via support shaft 67 move upward. As a result, engaging portions 56E and 66E leave locking portions 57B and 58B, respectively, thereby releasing the locked state.

Figure 11A:
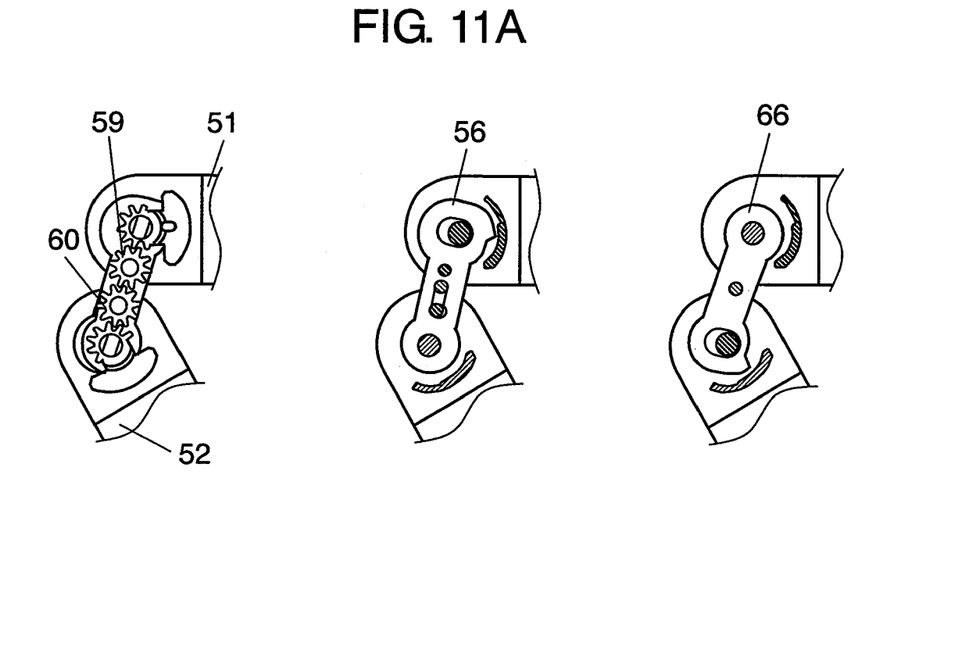
FIG. 11A is a partial side view of the opening-closing device according to the second embodiment of the present invention.

The following is a description of operations that are performed when the user further moves movable housing 42 in the opening direction as shown in FIG. 7C. First, as shown in FIG. 11A, conversion gear 59 rotates counterclockwise, and relay gear 60 rotates clockwise. Thus, movable holder 52 is biased in the opening direction while rotating in the opening direction in the same manner as in the first embodiment.

Figure 11B:
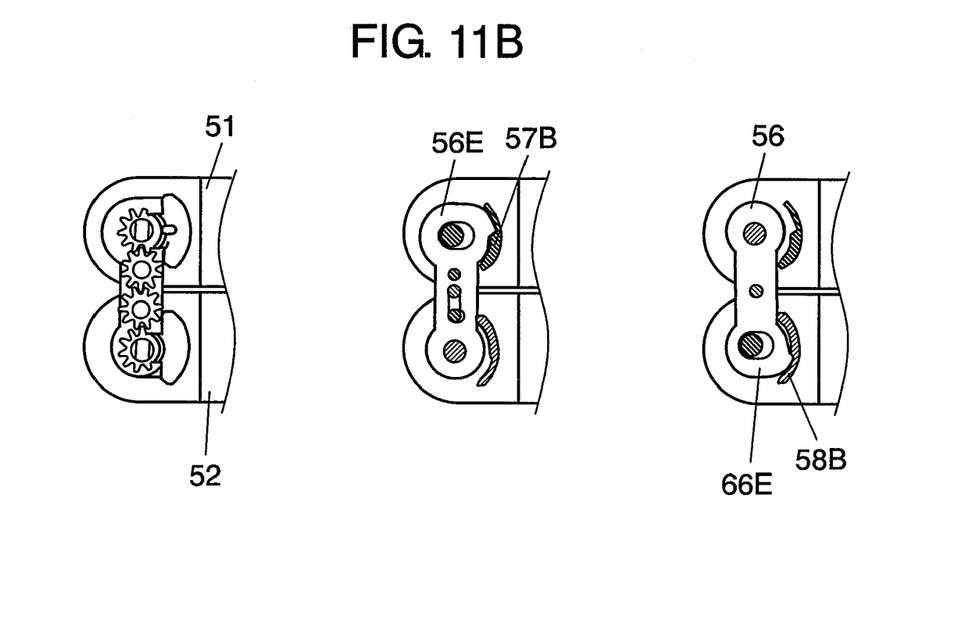
FIG. 11B is a partial side view of the opening-closing device according to the second embodiment of the present invention.

As shown in FIG. 11B, movable holder 52 is biased in the bottom surface direction of fixed holder 51 so as to rotate 360 degrees with respect to fixed holder 51 and be laid on the bottom surface of fixed holder 51. Then, engaging portion 56E of locking plate 56 is contacted with locking portion 57B of fixed body 57, and engaging portion 66E of reinforcing locking plate 66 is contacted with locking portion 58B of movable body 58. As a result, as shown in FIG. 7D, in the electronic device, movable housing 42 is laid and held on the bottom surface of fixed housing 41.

As described hereinbefore, the present embodiment includes reinforcing locking plate 66, which is rotatably supported in the substantial center of locking plate 56, and engaging portion 66E of reinforcing locking plate 66, which is contacted with locking portion 58B of movable body 58 at a predetermined angle. Thus, when opened at a predetermined angle, engaging portion 56E of locking plate 56 is contacted with locking portion 57B corresponding thereto, and engaging portion 66E of reinforcing locking plate 66 is contacted with locking portion 58B corresponding thereto. As a result, movable holder 52 can be held more securely with respect to fixed holder 51 in the second embodiment than in the first embodiment.

In the aforementioned description, locking portion 57B, which is contacted with engaging portion 56E of locking plate 56, is formed in fixed body 57. Locking portion 58B, which is contacted with engaging portion 66E of reinforcing locking plate 66, is formed in movable body 58. Alternatively, it is possible to form a locking portion, which is contacted with engaging portion 56E of locking plate 56, at the left end of fixed holder 51, and a locking portion, which is contacted with engaging portion 66E of reinforcing locking plate 66, at the left end of movable holder 52.

What is claimed is:

1. An opening-closing device comprising:
   a fixed holder;
   a fixed body connected to the fixed holder and including a fixed gear;
   a movable holder;
   a movable body connected to the movable holder and including a movable gear;
   a conversion gear engaged with the fixed gear;
   a relay gear engaged with the conversion gear and the movable gear;
   a first locking plate coupled to the fixed gear, the first locking plate rotatably coupled to the fixed holder via a fixed shaft, the first locking plate further being pivotably coupled to the fixed shaft;
   a first locking portion formed at one of the fixed body and the fixed holder; and
   a first engaging portion projecting outwardly from the first locking plate in a radial direction of the fixed shaft, the first locking plate interacting with the first engaging portion along a radial side,
   wherein when the movable holder is opened from a closed position to a first predetermined angle with respect to the fixed holder the first engaging portion engages the first locking portion such that the movable holder is not openable beyond the first predetermined angle with respect to the fixed holder unless the movable holder is partially closed from the first predetermined angle, and
   when the movable holder is partially closed from the first predetermined angle the first engaging portion disengages from the first locking portion such that the movable holder is openable to a second predetermined angle greater than the first predetermined angle.

2. The opening-closing device of claim 1, further comprising:
   a second locking plate coupled to a center of the first locking plate, the second locking plate rotatably coupled to the movable holder via a movable shaft, the second locking plate further being pivotably coupled to the movable shaft;
   a second locking portion formed at one of the movable body and the movable holder; and
   a second engaging portion projecting outwardly from the second locking plate in a radial direction of the movable shaft,
   wherein when the movable holder is opened from the closed position to the first predetermined angle with respect to the fixed holder the second engaging portion engages the second locking portion such that the movable holder is not openable beyond the first predetermined angle with respect to the fixed holder unless the movable holder is partially closed from the first predetermined angle, and
   when the movable holder is partially closed from the first predetermined angle the second engaging portion disengages from the second locking portion such that the movable holder is openable to the second predetermined angle.

3. The opening-closing device of claim 1, wherein the first predetermined angle is about 160 degrees.

4. The opening-closing device of claim 1, wherein the second predetermined angle is about 360 degrees.

5. The opening-closing device of claim 2, wherein the first predetermined angle is about 160 degrees.

6. The opening-closing device of claim 2, wherein the second predetermined angle is about 360 degrees.

7. The opening-closing device of claim 1, wherein when the movable holder is partially closed from the first predetermined angle the first engaging portion disengages from the first locking portion such that the movable holder is openable to a second predetermined angle greater than the first predetermined angle absent the first engaging portion re-engaging the first locking portion at the first predetermined angle.

8. The opening-closing device of claim 2, wherein when the movable holder is partially closed from the first predetermined angle the second engaging portion disengages from the second locking portion such that the movable holder is openable to a second predetermined angle greater than the first predetermined angle absent the second engaging portion re-engaging the second locking portion at the first predetermined angle.

9. The opening-closing device of claim 1, wherein the first locking plate has first, second, third, and fourth holes,
   the movable gear is coupled to the first locking plate via a movable shaft inserted into the movable gear and the first hole,
   the relay gear is coupled to the first locking plate via a relay shaft inserted into the relay gear and the second hole,
   the conversion gear is coupled to the first locking plate via a conversion shaft which is inserted into the conversion gear and is fixed to the third hole, and
   the fixed gear is coupled to the first locking plate via the fixed shaft inserted into the fixed gear and the fourth hole, and
   wherein the first hole has a larger diameter than a diameter of the movable shaft, the second hole has a non-circular shape having a larger diameter than a diameter of the relay shaft, the fourth hole has a non-circular shape having a larger diameter than a diameter of the fixed shaft such that when the movable holder is partially closed from the first predetermined angle the first locking plate moves with respect to the first locking portion so as for the first engaging portion to disengage from the first locking portion.

10. The opening-closing device of claim 2, wherein the first locking plate has first, second, third, and fourth holes,
    the movable gear is coupled to the first locking plate via a movable shaft inserted into the movable gear and the first hole,
    the relay gear is coupled to the first locking plate via a relay shaft inserted into the relay gear and the second hole,
    the conversion gear is coupled to the first locking plate via a conversion shaft which is inserted into the conversion gear and is fixed to the third hole, and
    the fixed gear is coupled to the first locking plate via the fixed shaft inserted into the fixed gear and the fourth hole, and
    wherein the first hole has a larger diameter than a diameter of the movable shaft, the second hole has a non-circular shape having a larger diameter than a diameter of the relay shaft, the fourth hole has a non-circular shape having a larger diameter than a diameter of the fixed shaft such that when the movable holder is partially closed from the first predetermined angle the first locking plate moves with respect to the first locking portion so as for the first engaging portion to disengage from the first locking portion.

11. The opening-closing device of claim 10, wherein the second locking plate has fifth and sixth holes, the movable gear is coupled to the second locking plate via the movable shaft inserted into the movable gear and the fifth hole, and the fixed gear is coupled to the second locking plate via the fixed shaft inserted into the fixed gear and the sixth hole, and wherein the fifth hole has a non-circular shape having a larger diameter than a diameter of the movable shaft, such that when the movable holder is partially closed from the first predetermined angle the second locking plate moves with respect to the second locking portion so as for the second engaging portion to disengage from the second locking portion.

\* \* \* \* \*